United States Patent
Chung

(10) Patent No.: US 9,111,820 B2
(45) Date of Patent: *Aug. 18, 2015

(54) EMBEDDED PACKAGE AND METHOD FOR MANUFACTURING THE SAME

(71) Applicant: SK hynix Inc., Incheon-si Gyeonggi-do (KR)

(72) Inventor: Qwan Ho Chung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/217,624

(22) Filed: Mar. 18, 2014

(65) Prior Publication Data

US 2014/0291837 A1 Oct. 2, 2014

Related U.S. Application Data

(63) Continuation of application No. 13/334,391, filed on Dec. 22, 2011, now Pat. No. 8,710,652.

(30) Foreign Application Priority Data

Aug. 11, 2011 (KR) .................. 10-2011-0080043

(51) Int. Cl.
| | |
|---|---|
| *H01L 23/498* | (2006.01) |
| *H01L 23/48* | (2006.01) |
| *H01L 21/56* | (2006.01) |
| *H01L 23/00* | (2006.01) |
| *H01L 23/31* | (2006.01) |

(52) U.S. Cl.
CPC ............... *H01L 24/14* (2013.01); *H01L 24/19* (2013.01); *H01L 24/20* (2013.01); *H01L 23/3128* (2013.01); *H01L 2224/12105* (2013.01); *H01L 2224/32225* (2013.01); *H01L 2224/73267* (2013.01); *H01L 2224/92144* (2013.01); *H01L 2924/01029* (2013.01); *H01L 2924/15311* (2013.01)

(58) Field of Classification Search
CPC ......... H01L 24/14; H01L 24/19; H01L 24/20; H01L 23/3128; H01L 2224/12105
USPC ............. 257/37, 48, 659, 698, 737, 774, 775, 257/E21.449, E21.504, E23.01, E23.068, 257/E23.169; 438/107, 124, 613
See application file for complete search history.

(56) References Cited

U.S. PATENT DOCUMENTS

| | | | | |
|---|---|---|---|---|
| 8,710,652 | B2 * | 4/2014 | Chung ........................ | 257/737 |
| 2003/0230804 | A1 * | 12/2003 | Kouno et al. .................. | 257/734 |
| 2008/0308933 | A1 * | 12/2008 | Tay et al. ...................... | 257/738 |
| 2011/0095439 | A1 * | 4/2011 | Chin ............................. | 257/774 |

* cited by examiner

*Primary Examiner* — Dao H Nguyen
(74) *Attorney, Agent, or Firm* — William Park & Associates Ltd.

(57) ABSTRACT

An embedded package includes a semiconductor chip divided into a cell region and a peripheral region, having a first surface and a second surface which faces away from the first surface, and including an integrated circuit which is formed in the cell region on the first surface, a bonding pad which is formed in the peripheral region on the first surface and a bump which is formed over the bonding pad; a core layer attached to the second surface of the to semiconductor chip; an insulation component formed over the core layer including the semiconductor chip and having an opening which exposes the bump; and a circuit wiring line formed over the insulation component and the bump and electrically connected to the bump, wherein the insulation component formed in the cell region has a thickness larger than a height of the bump.

16 Claims, 11 Drawing Sheets

EMBEDDED PACKAGE AND METHOD FOR MANUFACTURING THE SAME

CROSS-REFERENCE TO RELATED APPLICATIONS

The present application claims priority to Korean patent application number 10-2011-80043 filed on Aug. 11, 2011, which is incorporated herein by reference in its entirety.

BACKGROUND OF THE INVENTION

With broadening use of portable electronic products, semiconductor devices require increasingly miniaturization and large capacity. To achieve the miniaturization and the large capacity, a large number of semiconductor chips need to be mounted in a semiconductor package and the semiconductor package need to be light, thin and compact. In an effort to achieve the above structure, an embedded package has been suggested in the art, in which a chip is embedded in a board instead of being arranged on the surface of a board.

FIG. 1 is a cross-sectional view illustrating a known embedded package.

Referring to FIG. 1, a bump 2 is formed on a bonding pad 1A of a semiconductor chip 1. The semiconductor chip 1 is attached to a core layer 3 in a face-up type by the medium of an adhesive component 8, and an insulation component 4 is laminated on the semiconductor chip 1 and the core layer 3. Then, the insulation component 4 is etched to be planarized such that the bump 2 is exposed. After forming a circuit wiring line 5 on the bump 2 and the insulation component 4 to be electrically connected to the bump 2, a solder resist pattern 6 is formed on the insulation component 4 and the circuit wiring line 5 to expose a portion of the circuit wiring line 5, and a solder ball 7 is mounted to the exposed portion of the circuit wiring line 5.

The embedded package configured as mentioned above provides an advantage in terms of high speed operation due to the fact that the transfer length of an electrical signal between the semiconductor chip 1 and an external connection terminal such as the solder ball 7 is shortened. However, because a distance H between an active region of the semiconductor chip 1 and the circuit wiring line 5 is short, parasitic capacitance induced between the integrated circuit of the semiconductor chip 1 and the circuit wiring line 5 becomes large, and it is difficult to achieve high speed operation in spite of the shortened transfer length of an electrical signal.

While the distance H between the semiconductor chip 1 and the circuit wiring line 5 may be lengthened by increasing the height of the bump 2, if the height of the bump 2 increases, adjacent bumps 2 may be short-circuited.

BRIEF SUMMARY OF THE INVENTION

An embodiment of the present invention is directed to an embedded package which is suitable for a high speed operation.

Also, an embodiment of the present invention is directed to a method for manufacturing the embedded package.

In an embodiment of the present invention, an embedded package includes: a semiconductor chip divided into a cell region and a peripheral region, having a first surface and a second surface which faces away from the first surface, and including an integrated circuit which is formed in the cell region on the first surface, a bonding pad which is formed in the peripheral region on the first surface and a bump which is formed over the bonding pad; a core layer attached to the second surface of the semiconductor chip; an insulation member formed over the core layer including the semiconductor chip and having an opening which exposes the bump; and a circuit wiring line formed over the insulation member and the bump and electrically connected with the bump, wherein the insulation member formed in the cell region has a thickness larger than a height of the bump.

The insulation member formed in the cell region may have a thickness larger than the height of the bump by 10~500 μm.

The insulation member formed in the peripheral region may have a thickness identical to or smaller than the thickness of the insulation member formed in the cell region.

The insulation member in the peripheral region may be formed to have a thickness that is the same as the height of the bump on both sides of the bump and gradually increases from both sides of the bump toward the cell region. In detail, the insulation member formed in the peripheral region may have a straight slope. In this case, an angle defined by an upper surface of the bump and an upper surface of the insulation member formed in the peripheral region may be an acute angle. Unlike this, the insulation member formed in the peripheral region may have a step-like shape or a curved slope. Meanwhile, the insulation member formed in the peripheral region may have a thickness the same as the height of the bump.

The embedded package may further include: a solder resist pattern formed over the insulation member and the circuit wiring line and exposing a portion of the circuit wiring line; and an external connection terminal mounted to the portion of the circuit wiring line which is exposed through the solder resist pattern.

the cell region is divided into at least two sections, and the peripheral region is formed between the sections.

In an embodiment of the present invention, a method for manufacturing an embedded package includes: preparing a semiconductor chip divided into a cell region and a peripheral region, having a first surface and a second surface which faces away from the first surface, and including an integrated circuit which is formed in the cell region on the first surface, a bonding pad which is formed in the peripheral region on the first surface and a bump which is formed over the bonding pad; attaching the second surface of the semiconductor chip to a core layer; forming an insulation member over the semiconductor chip and the core layer to have an opening which exposes the bump and a thickness that is larger than a height of the bump; and forming a circuit wiring line over the insulation member to be electrically connected with the bump.

The forming of the insulation member and the forming of the circuit wiring line may include: placing a preliminary insulation member, which has a third surface and a fourth surface facing away from the third surface and is formed with a conductive layer on the third surface, over the core layer such that the fourth surface faces the semiconductor chip; laminating the preliminary insulation member over the semiconductor chip and the core layer using a mold which has a projection corresponding to the peripheral region, such that the conductive layer is electrically connected with the bump; and pattering the conductive layer and forming the circuit wiring line.

The forming of the insulation member may include: placing a preliminary insulation member over the core layer including the semiconductor chip; and laminating the preliminary insulation member over the semiconductor chip and the core layer using a mold which has a projection corresponding to the peripheral region, such that the bump is exposed.

The forming of the insulation member may include: placing a preliminary insulation member over the core layer including the semiconductor chip; laminating the preliminary insulation member over the core layer and the semiconductor chip and forming the insulation member which covers the bump; and removing a portion of the insulation member in the peripheral region such that the bump is exposed.

After the forming of the circuit wiring line, the method may further include: forming a solder resist pattern on the insulation member and the circuit wiring line to have an opening which exposes a portion of the circuit wiring line; and mounting an external connection terminal to the exposed portion of the circuit wiring line.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 2:
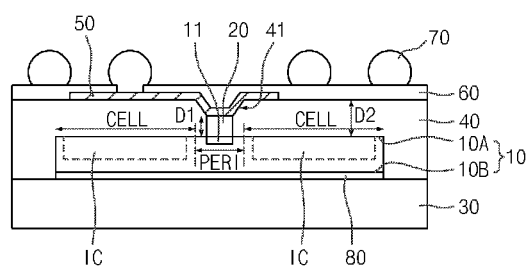
FIG. 2 is a cross-sectional view illustrating an embedded package in accordance with an embodiment of the present invention.

FIG. 2 is a cross-sectional view illustrating an embedded package in accordance with an embodiment of the present invention.

Referring to FIG. 2, an embedded package in accordance with an embodiment of the present invention includes a semiconductor chip 10, a core layer 30, an insulation component 40, and a circuit wiring line 50. Besides, the embedded package may further include a solder resist pattern 60 and an external connection terminal 70.

The semiconductor chip 10 is divided into cell regions CELL and a peripheral region PERI, and has a first surface 10A, a second surface 105, integrated circuits IC according to a chip design, a bonding pad 11, and a bump 20.

The first surface 10A faces away from the second surface 10B. The integrated circuits IC are formed in the cell regions CELL on the first surface 10A of the semiconductor chip 10, and the bonding pad 11 is formed in the peripheral region PERI on the first surface 10A of the semiconductor chip 10. While not shown in the drawing, the bonding pad 11 is electrically connected to the integrated circuits IC. In an embodiment of the present invention, the bonding pad 11 is formed along the center portion of the first in surface 10A of the semiconductor chip 10. That is, the semiconductor chip 10 has a center pad type structure. Alternatively, the bonding pad 11 may be formed adjacent to the edge of the first surface 10A of the semiconductor chip 10. That is, the semiconductor chip 10 may have an edge pad type structure.

The bump 20 is formed on the bonding pad 11. The bump 20 may include one or more of copper, aluminum, gold, silver, etc., and may have, for example, a pillar shape.

The second surface 106 of the semiconductor chip 10 is attached to a core layer 30 by the medium of an adhesive component 80. In other words, the semiconductor chip 10 is attached to the core layer 30 in a face-up type. The adhesive component 80 may include an adhesive paste or a double-sided adhesive tape. For example, the core layer 30 may include a combination of a reinforcing material and a resin, such as glass fiber and epoxy resin, paper and, phenol resin, and paper and epoxy resin.

The insulation component 40 is formed on the semiconductor chip 10 and the core layer 30 and has an opening 41 which exposes the bump 20. The insulation component 40, which is formed in the cell regions CELL of the semiconductor chip 10, has a thickness larger than the height of the bump 20. In other words, when the height of the bump 20 is D1 and the thickness of the insulation component 40 formed in the cell regions CELL of the semiconductor chip 10 is D2, D2 is greater than D1. For example, D2-D1 has the range of 10~500 µm.

The insulation component 40 formed in the peripheral region PERI has a thickness that is the same as the height of the bump 20 on both sides of the bump 20 and gradually increases is from both sides of the bump 20 toward the cell regions CELL. In an embodiment of the present embodiment, the upper surface of the insulation component 40 formed in the peripheral region PERI has a straight slope. The angle between the upper surface of the bump 20 and the upper surface of the insulation component 40 formed in the peripheral region PERI may be an acute angle.

The insulation component 40 may include a thermosetting resin or a thermoplastic resin.

The circuit wiring line 50 is formed on the insulation component 40 and the bump 20, and is electrically connected to the bump 20. The circuit wiring line 50 may include one or more of copper, nickel and gold.

The solder resist pattern 60 is formed on the insulation component 40 and the circuit wiring line 50 and exposes a portion of the circuit wiring line 50. The external connection terminal 70 is mounted to the portion of the circuit wiring line 50 which is exposed through the solder resist pattern 60. The external connection terminal 70 includes a solder ball or a bump.

Figure 3:
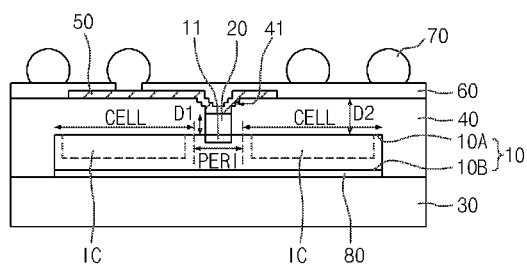
FIG. 3 is a cross-sectional view illustrating an embedded package in accordance with an embodiment of the present invention.

FIG. 3 is a cross-sectional view illustrating an embedded package in accordance with an embodiment of the present invention.

The embedded package in accordance with an embodiment of the present invention may have substantially the same configuration as the embedded package according to the embodiment described above with reference to FIG. 2 except an insulation component 40 formed in a peripheral region PERI. Therefore, repeated descriptions for the same components will be omitted herein, and the same terms and the same reference numerals will be used to refer to the same components.

Referring to FIG. 3, an insulation component 40 formed in a peripheral region PERI has a thickness that is the same as the height of a bump 20 on both sides of the bump 20 and increases stepwise from both sides of the bump 20 toward cell regions CELL. In an embodiment of the present embodiment, the insulation component 40 formed in the peripheral region PERI has a step-like shape.

Figure 4:
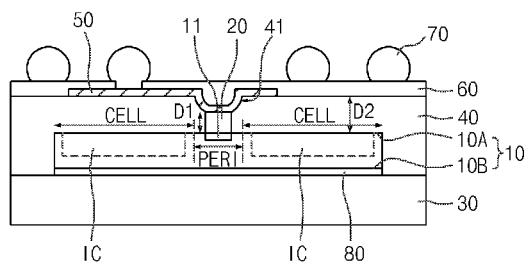
FIG. 4 is a cross-sectional view illustrating an embedded package in accordance with an embodiment of the present invention.

FIG. 4 is a cross-sectional view illustrating an embedded package in accordance with an embodiment of the present invention.

The embedded package in accordance with an embodiment of the present invention may have substantially the same configuration as the embedded package according to the, embodiment described above with reference to FIG. 2 except an insulation component 40 formed in a peripheral region PERI. Therefore, repeated descriptions for the same components will be omitted herein, and the same terms and the same reference numerals will be used to refer to the same components.

Referring to FIG. 4, an insulation component 40 formed in a peripheral region PERI has a thickness that is the same as the height of a bump 20 on both sides of the bump 20 and gradually increases from both sides of the bump 20 toward cell regions CELL. In an embodiment of the present embodiment, the insulation component 40 formed in the peripheral region PERI has a curved slope.

Figure 5:
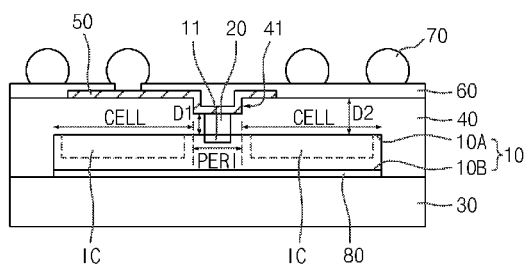
FIG. 5 is a cross-sectional view illustrating an embedded package in accordance with an embodiment of the present invention.

FIG. 5 is a cross-sectional view illustrating an embedded package in accordance with an embodiment of the present invention.

The embedded package in accordance with an embodiment of the present invention may have substantially the same configuration as the embedded package according to the embodiment described above with reference to FIG. 2 except an insulation component 40. Therefore, repeated descriptions for the same components will be omitted herein, and the same terms and the same reference numerals will be used to refer to the same components.

Referring to FIG. 5, an insulation component 40 is formed on a semiconductor chip 10 and a core layer 30 and has an opening 41 which exposes a bump 20. The insulation component 40, which is formed in cell regions CELL of the semiconductor chip 10, has a thickness larger than the height of the bump 20. In other words, when the height of the bump 20 is D1 and the thickness of the insulation component 40 formed in the cell regions CELL of the semiconductor chip 10 is D2, D2 is greater than D1. For example, D2-D1 has the range of 10~500 μm.

In an embodiment of the present embodiment, the insulation component 40 formed in the peripheral region PERI has the same thickness as the bump 20, that is, D1.

FIGS. 6 to 12 are cross-sectional views explaining a method for manufacturing the embedded package in accordance with an embodiment of the present invention.

Figure 6:
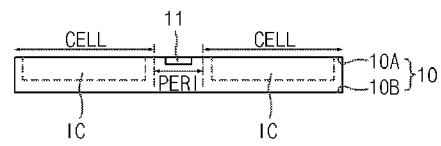
FIGS. 6 to 12 are cross-sectional views explaining a method for manufacturing the embedded package in accordance with an embodiment of the present invention.

Referring to FIG. 6, in order to manufacture an embedded semiconductor package, a semiconductor chip 10 is manufactured through a semiconductor device manufacturing process. The semiconductor chip 10 is divided into cell regions CELL and a peripheral region PERI and has integrated circuits IC and a bonding pad 11 which are respectively formed in the cell regions CELL and the peripheral region PERI.

Hereinafter, one surface of the semiconductor chip 10 on which the integrated circuits IC and the bonding pad 11 are formed will be referred to as a first surface 10A, and the other surface of the semiconductor chip 10 which faces away from the first surface 10A will be referred to as a second surface 10B.

Figure 7:
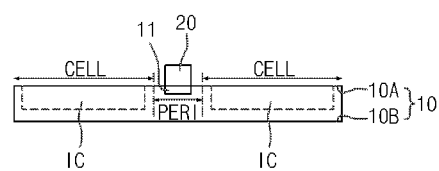

Referring to FIG. 7, a bump 20 is formed on the bonding pad 11. The bump 20 may include one or more of copper, aluminum, gold, silver, etc., and may have, for example, a pillar shape.

Figure 8:
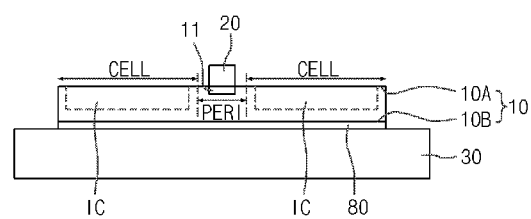

Referring to FIG. 8, the second surface 108 of the semiconductor chip 10 is attached to a core layer 30 by the medium of an adhesive component 80. For example, the core layer 30 may include a combination of a reinforcing material and a resin, such as glass fiber and epoxy resin, paper and phenol resin, and paper and epoxy resin.

Figure 9:
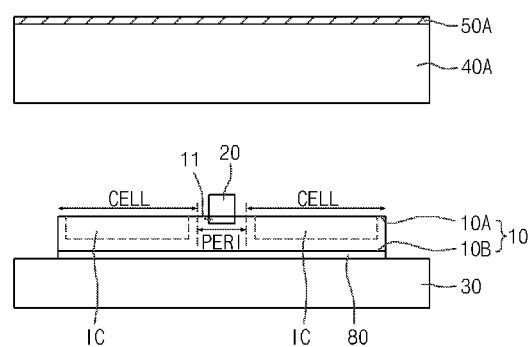

Referring to FIG. 9, a preliminary insulation component 40A which is formed with a conductive layer 50A on one surface thereof is prepared. Hereinafter, one surface of the preliminary insulation component 40A which is formed with the conductive layer 50A will be referred to as a third surface, and the other surface of the preliminary insulation component 40A which faces away from the third surface will be referred to as a fourth surface. The preliminary insulation component 40A may include a thermosetting resin or a thermoplastic resin, and the conductive layer 50A may include one or more of copper, nickel and gold.

Then, the preliminary insulation component 40A is formed over the semiconductor chip 10 and the core layer 30 such that the fourth surface of the preliminary insulation component 40A faces the semiconductor chip 10.

Figure 10:
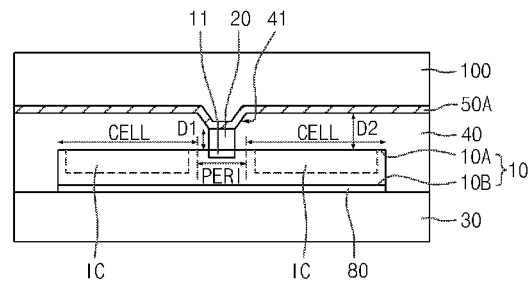

Referring to FIG. 10, the preliminary insulation component 40A is laminated on the semiconductor chip 10 and the core layer 30 using a mold 100 which has a projection corresponding to the peripheral region PERI of the semiconductor chip 10, such that the conductive layer 50A is connected to the bump 20, thereby forming an insulation component 40. Through such a series of processes, the insulation component 40 has an opening 41 which exposes the bump 20, and the conductive layer 50A is connected to the bump 20 through the opening 41.

Here, as the preliminary insulation component 40A is pressed using the mold 100 having the projection corresponding to the peripheral region PERI until the conductive layer 50A is connected to the bump 20, the insulation component 40 formed in the cell regions CELL of the semiconductor chip 10 has a thickness larger than the height of the bump 20. In other words, when the height of the bump 20 is D1 and the thickness of the insulation component 40 formed in the cell regions CELL of the semiconductor chip 10 is D2, D2 is greater than D1. The insulation component 40 formed in the peripheral region PERI has a shape corresponding to the shape of the projection of the mold 100.

While it is illustrated in an embodiment of the present invention that the side surfaces of the projection of the mold 100 have a straight slope, the shape of the projection of the mold 100 is not specifically limited. For example, the side surfaces of the projection of the mold 100 may have a step-like shape or may have a curved slope.

Figure 11:
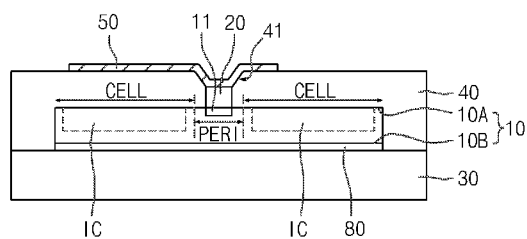

Referring to FIG. 11, by patterning the conductive layer 50A, a circuit wiring line 50, which is electrically connected to the bump 20, is formed.

In order to form the circuit wiring line 50, a photoresist (not shown) may be formed on the conductive layer 50A and may be selectively exposed, a photoresist pattern may be formed by developing the exposed photoresist, the conductive layer 50A may be etched using the photoresist pattern as a mask, and then the photoresist pattern may be removed.

In order to prevent the depth of a focus of exposing light from deviating due to an unevenness between the peripheral region PERI and the cell regions CELL when performing a process for exposing the photoresist, the photoresist of the peripheral region PERI and the cell regions CELL may not be simultaneously exposed and may be exposed separately from each other.

Figure 12:
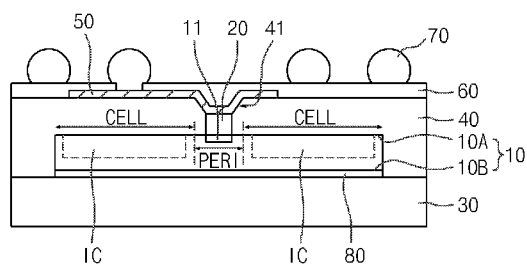

Referring to FIG. 12, by forming a solder resist on the circuit wiring line 50 and the insulation component 40 and patterning the solder resist, a solder resist pattern 60, which has an opening for exposing a portion of the circuit wiring line 50, is formed. Next, an external connection terminal 70 is mounted to the exposed portion of the circuit wiring line 50. As the external connection terminal 70, a solder ball may be used.

FIGS. 13 to 20 are cross-sectional views explaining a method for manufacturing the embedded package in accordance with an embodiment of the present invention.

Figure 13:
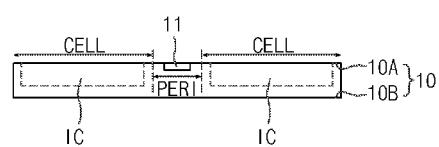
FIGS. 13 to 21 are cross-sectional views explaining a method for manufacturing the embedded package in accordance with an embodiment of the present invention.

Referring to FIG. 13, in order to manufacture an embedded semiconductor package, a semiconductor chip 10 is manufactured through a semiconductor device manufacturing process. The semiconductor chip 10 is divided into cell regions CELL and a peripheral region PERI and has integrated circuits IC and a bonding pad 11 which are respectively formed in the cell regions CELL and the peripheral region PERI.

Hereinafter, one surface of the semiconductor chip 10 on which the integrated circuits IC and the bonding pad 11 are formed will be referred to as a first surface 10A, and the other surface of the semiconductor chip 10 which faces away from the first surface 10A will be referred to as a second surface 10B.

Figure 14:
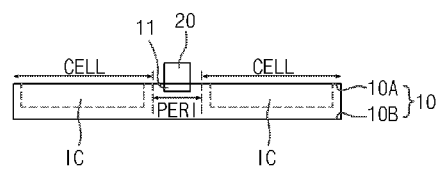

Referring to FIG. 14, a bump 20 is formed on the bonding pad 11. The bump 20 may include one or more of copper, aluminum, gold, silver, etc., and may have, for example, a pillar shape.

Figure 15:
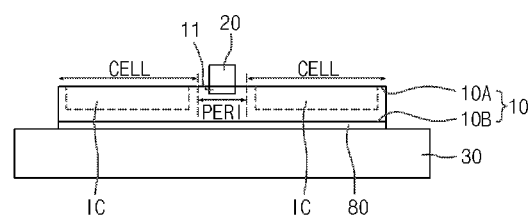

Referring to FIG. 15, the second surface 10B of the semiconductor chip 10 is attached to a core layer 30 by the medium of an adhesive component 80. For example, the core layer 30 may include a combination of a reinforcing material and a resin, such as glass fiber and epoxy resin, paper and phenol resin, and paper and epoxy resin.

Figure 16:
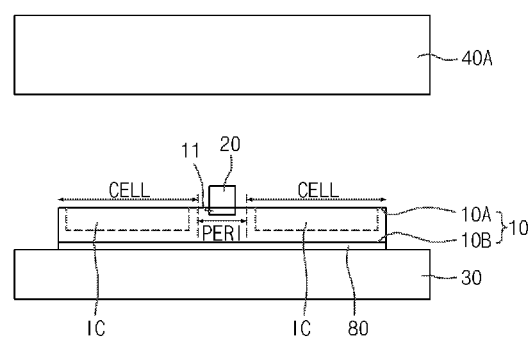

Referring to FIG. 16, a preliminary insulation component 40A is formed over the core layer 30 including the semiconductor chip 10. The preliminary insulation component 40A may include a thermosetting resin or a thermoplastic resin.

Figure 17:
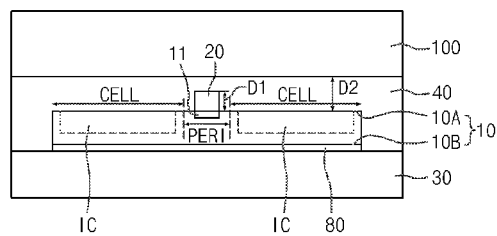

Referring to FIG. 17, the preliminary insulation component 40A is laminated on the semiconductor chip 10 and the core layer 30 using a mold 100 which has a planarized surface contour, thereby forming an insulation component 40 covering the bump 20. When the height of the bump 20 is D1 and the thickness of the insulation component 40 formed in the cell regions CELL of the semiconductor chip 10 is D2, D2 is greater than D1. For example, D2-D1 has the range of 10~500 μm.

Figure 18:
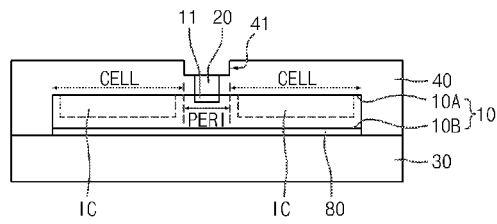

Referring to FIG. 18, by removing a portion of the insulation component 40 in the peripheral region PERI, an opening 41 is formed to expose the bump 20. As a way of removing the portion of the insulation component 40, any one of an etching process, a drilling process and a laser drilling process may be used Although it is illustrated and described in an embodiment of the present invention that, after forming the insulation component 40 which covers the bump 20, the bump 20 is exposed by removing the portion of the insulation component 40, it should be readily understood that the insulation component 40, which has the opening 41 for exposing the bump 20, may be formed by laminating the preliminary insulation component 40A on the semiconductor chip 10 and the core layer 30 using the mold 100 in (see FIG. 8) having the projection corresponding to the peripheral region PERI of the semiconductor chip 10 such that the bump 20 is exposed.

Figure 19:
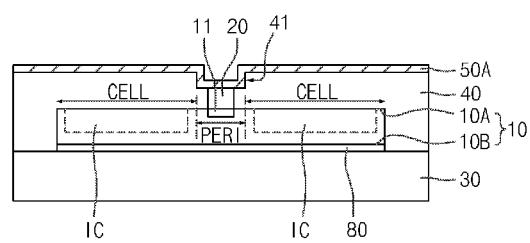

Referring to FIG. 19, a conductive layer 50A is formed on the bump 20 and the insulation component 40. The conductive layer 50A may include one or more of copper, nickel and gold.

Figure 20:
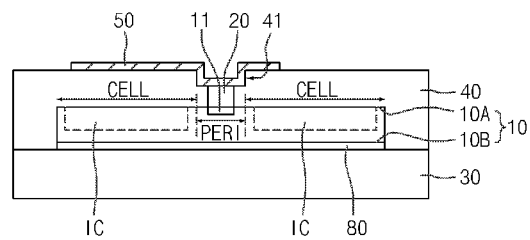
Figure 21:
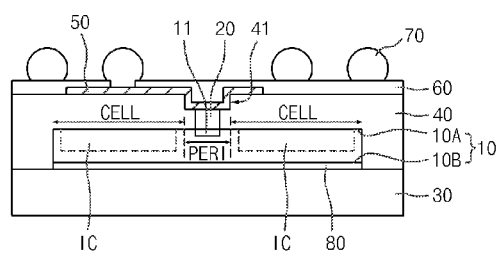

Referring to FIG. 20, by patterning the conductive layer 50A, a circuit wiring line 50, which is electrically connected to the bump 20, is formed.

In order to form the circuit wiring line 50, a photoresist (not shown) may be formed on the conductive layer 50A and may be selectively exposed to define a region in which a circuit wiring line is to be formed, a photoresist pattern may be formed by developing the exposed photoresist, the conductive layer 50A may be etched using the photoresist pattern as a mask, and then the photoresist pattern may be removed.

In order to prevent the depth of a focus of exposing light from deviating due to an unevenness between the peripheral region PERI and regions excluding the peripheral region PERI when performing a process for exposing the photoresist, the photoresist of the peripheral region PERI and the cell regions CELL may not be simultaneously exposed and may be exposed separately from each other.

Figure 1:
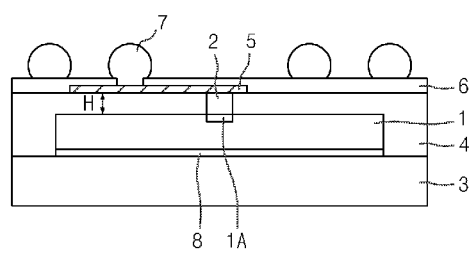
FIG. 1 is a cross-sectional view illustrating a conventional embedded package.

Referring to FIG. 1, by forming a solder resist on the circuit wiring line 50 and the insulation component 40 and patterning the solder resist, a solder resist pattern 60, which has an opening for exposing a portion of the circuit wiring line 50, is formed. Next, an external connection terminal 70 is mounted to the exposed portion of the circuit wiring line 50. As the external connection terminal 70, a solder ball may be used.

As is apparent from the above description, the embedded package and the method for manufacturing the same in accordance with the embodiments of the present invention provide advantages in that, since a distance between a cell region and a circuit wiring line of a semiconductor chip is increased, parasitic capacitance is reduced, whereby the operation speed of the embedded package may be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. An embedded package comprising:
a semiconductor chip having a first surface and a second surface, the first surface including a cell region and a peripheral region,
wherein an integrated circuit is formed in the cell region; and
wherein a bonding pad having a bump formed thereon is formed in the peripheral region;
an insulation component formed over the first surface while exposing the bump therethrough; and
a circuit wiring line formed over the insulation component and the bump,
wherein the bump is coupled to the circuit wiring line, and
wherein the circuit wiring line comprises a first portion of the circuit wiring line formed on the cell region, and a second portion of the circuit wiring line formed on the peripheral region,
wherein the insulation component comprises a first portion of the insulation component disposed between the first portion of the circuit wiring line and the first surface of the semiconductor chip, and a second portion of the insulation component disposed between the second portion of the circuit wiring line and the first surface of the semiconductor chip, and
wherein a thickness of the first portion of the insulation component is larger than a thickness of the second portion of the insulation component.

2. The embedded package according to claim 1, wherein the insulation component formed over all of the cell region has a thickness larger than a height of the bump.

3. The embedded package according to claim 1, wherein the insulation component formed in the cell region has a thickness larger than the height of the bump by 10 to 500 μm.

4. The embedded package according to claim 1, wherein the insulation component formed in the peripheral region has a thickness identical to or smaller than the thickness of the insulation component formed in the cell region.

5. The embedded package according to claim 4, wherein the insulation component in the peripheral region is formed to have a thickness that is the same as the height of the bump on both sides of the bump and gradually increases from both sides of the bump toward the cell region.

6. The embedded package according to claim 4, wherein the insulation component formed in the peripheral region has a straight slope.

7. The embedded package according to claim 4, wherein an angle formed by an upper surface of the bump and an upper surface of the insulation component formed in the peripheral region is an acute angle.

8. The embedded package according to claim 4, wherein the insulation component formed in the peripheral region has a step-like shape.

9. The embedded package according to claim 4, wherein the insulation component formed in the peripheral region has a curved slope.

10. The embedded package according to claim 4, wherein the insulation component formed in the peripheral region has a thickness the same as the height of the bump.

11. The embedded package according to claim 1, further comprising:
    a solder resist pattern formed over the insulation component and the circuit wiring line and exposing a portion of the circuit wiring line.

12. The embedded package according to claim 11, further comprising:
    an external connection terminal mounted to the portion of the circuit wiring line which is exposed through the solder resist pattern.

13. The embedded package according to claim 1, the cell region is divided into at least two sections-, and the peripheral region is formed between the sections.

14. The embedded package according to claim 1, wherein the bump has pillar shape.

15. The embedded package according to claim 1, wherein the core layer is attached to the second surface by a medium of an adhesive component.

16. The embedded package according to claim 1, wherein the second portion of the circuit wiring line is coupled to the bump.

* * * * *